United States Patent [19]

Green et al.

[11] Patent Number: 4,499,152
[45] Date of Patent: Feb. 12, 1985

[54] METAL-CLAD LAMINATE CONSTRUCTION

[75] Inventors: Robert W. Green; Delton A. Grey, Jr., both of Schenectady, N.Y.

[73] Assignee: General Electric Company, Schenectady, N.Y.

[21] Appl. No.: 549,031

[22] Filed: Nov. 7, 1983

Related U.S. Application Data

[63] Continuation-in-part of Ser. No. 406,588, Aug. 9, 1982, abandoned.

[51] Int. Cl.³ .......................... B32B 9/04; B05D 5/12
[52] U.S. Cl. ..................................... 428/448; 427/96; 427/99; 427/123; 427/126.3; 427/217; 427/380; 428/450; 428/469; 428/901
[58] Field of Search ............... 428/336, 611, 457, 469, 428/448, 901, 450; 427/96, 99, 380, 126.3, 217, 123

[56] References Cited

U.S. PATENT DOCUMENTS 3,984,598 10/1976 Sarazin et al. ...................... 428/336
4,364,731 12/1982 Norling et al. .................. 428/448 X
4,383,003  5/1983 Lifshin et al. ...................... 428/611

Primary Examiner—Thomas J. Herbert
Attorney, Agent, or Firm—Leo I. MaLossi; James C. Davis, Jr.; James Magee, Jr.

[57] ABSTRACT

A metal-clad laminate having special utility in the production of high resolution printed circuit patterns and preparation of the laminate are described. The laminate preferably comprises a resin-bonded, glass-reinforced substrate, a layer of coupling agent covering and bonded to a major surface of the substrate, a layer of ultra-thin copper adjacent the layer of coupling agent, and a composite bonding layer disposed between the copper layer and the layer of coupling agent. The composite bonding layer comprises copper alloyed with at least one non-copper metal and oxide material of the non-copper metal.

15 Claims, 3 Drawing Figures

METAL-CLAD LAMINATE CONSTRUCTION

This application is a continuation-in-part of U.S. patent application Ser. No. 406,588—Green, et al, filed Aug. 9, 1982 (now abandoned) and assigned to the assignee of this application.

FIELD OF THE INVENTION

This invention relates to a metal-clad laminate particularly adaptable to the preparation of high resolution printed circuit boards. This invention is related to that disclosed and claimed in copending patent applications Ser. No. 277,290—Lifshin et al., filed Jan. 22, 1981 and now abandoned and Ser. No. 189,003—Lifshin et al., filed Sept. 22, 1980 and now issued as U.S. Pat. No. 4,383,003, both applications being assigned to the assignee hereof. Ser. No. 189,003 discloses a method for chemically bonding an ultra-thin copper film to a resin-bonded substrate and the products resulting from the method. Ser. No. 277,290 is directed to the method of depositing copper on a carrier surface while controlling the adhesion therebetween by maintaining the carrier surface at a temperature in the range of from about 100° to about 250° C. The aforementioned applications are incorporated by reference.

Among the disclosures in the prior art pertinent to this invention is U.S. Pat. No. 3,984,598—Sarazin et al. According to the Sarazin et al. teachings, a thin layer of copper (or other conductive metal, e.g. nickel, tin, gold, etc.) is plated on a transfer carrier surface treated with a release agent, subjected to a high current density to roughen the surface of the copper, the copper is oxidized and the copper oxide is then coated with coupling agent. The treated copper surface is next hot pressed against a resin-bonded substrate and the transfer carrier is separated from the copper layer, which remains bonded to the resin-bonded substrate. There is no disclosure therein of using a metal oxide layer in which the metal of an oxide incorporated therein is different from the metal of the conductive layer.

DEFINITIONS

As used herein, and in the appended claims, the term "carrier" includes aluminum sheet material which is of gauge thickness such that it can be run through a processing line and rolled for storage or shipment. In a more general sense it may include sheet material of other metals such as copper as well as of plastics, such as duPont commercial products known as MYLAR and KAPTON and other organic polymeric materials of similar flexibility so long as the material is able to withstand the processing temperatures involved in practicing this invention, have the strength at the temperature of deposition of a copper film thereon and have the characteristics of inertness and bondability to copper films necessary to preserve the integrity of the copper film-carrier sheet combination through subsequent processing and substrate attachment and to permit mechanical stripping of the carrier sheet without damaging the copper film.

"Ultra-thin" designates a thickness of less than about 16 microns.

"Film" and "foil" in this same context mean, respectively, an ultra-thin coating (e.g. of copper) and the combination of such ultra-thin coating with an applied coating containing oxide of a non-copper metal.

"Vapor deposition" means and includes sputtering, physical evaporation (i.e., electron beam, inductive and/or resistive evaporation), chemical vapor deposition, and ion plating.

"Substrate", as that term is used in this specification and the appended claims, means and refers to that part of the copper-clad laminate product or other articles of manufacture of this invention, which serves as the physical support means for the metal film or foil. The substrate material is preferably epoxy reinforced with glass fiber provided for lamination with the epoxy resin in the form of a prepreg cured during the lamination step. Other thermosetting resins such as phenolic resins, melamine resins, silicones, polyimide resins, acrylic resins, polyester resins, etc. may also be used and, as well, other base materials such as paper, fabrics, lignin, asbestos, synthetic fibers such as rayon, nylon, etc. may be used. One requirement of the substrates useful in this invention is the availability of coupling agents able to bond well to the substrate surface.

"Interacted coupling agent layer" means a layer of coupling agent molecules that have at least in large part chemically interacted with both the oxide layer and the surface of the substrate.

DESCRIPTION OF THE INVENTION

A film of copper, preferably 1 to 16 microns in thickness, is vapor deposited on a carrier. This film of copper is coated with a thin vapor deposited layer of a metal oxide or a mixture of metal oxides under conditions (i.e. vacuum and temperature) which preclude copper oxide formation. The metal oxide layer is then coated with a coupling agent. Thereafter, this assembly is laminated with a suitable substrate (i.e. one to whose surface the coupling agent will bond) by the application of heat and pressure. The carrier may be removed at the time of manufacture of an end product (e.g. a circuit board) or may remain in place for removal at a later time.

At least one oxide employed in the metal oxide layer will have as its metal component a metal other than copper (i.e. a second metal) and will be an oxide, which decomposes to a slight degree under the process conditions imposed during vapor deposition thereof. During lamination, the metallic component(s) released from the decomposed oxide material alloys with the copper. This typically results in discreet "islands" of alloy at the interface between the oxide layer and copper. It is believed that these alloy concentrations add significantly to the high peel strength in the resultant product. At the same time, decomposition of small quantities of the oxide being deposited produces some amount of suboxide in the oxide layer. The coupling agent provides the interconnection required between the oxide layer and the surface of the substrate. Peel strengths of greater than 9 lbs/in have been obtained using zinc oxide as the oxide component, particularly when the laminated product is given a subsequent heat treatment. Further improvement in peel strength (as much as 20 percent) is experienced as the result of short term (about 4 days) aging.

BRIEF DESCRIPTION OF THE DRAWINGS

The features of this invention believed to be novel and unobvious over the prior art are set forth with particularity in the appended claims. The invention itself, however, as to the organization, method of operation and objects and advantages thereof, may best be understood by reference to the following description taken in conjunction with the accompanying drawing wherein:

MANNER AND PROCESS OF MAKING AND USING THE INVENTION

Figure 1:
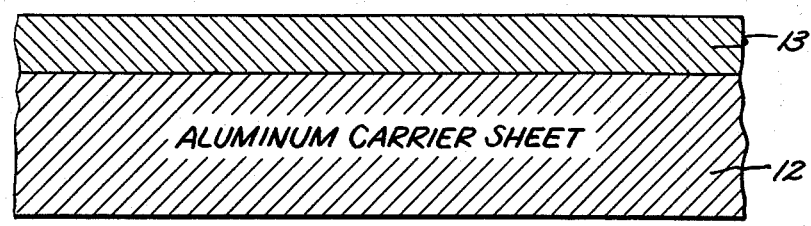
FIG. 1 is a schematic cross-sectional view of the initial stage of production of the metal-clad laminate of this invention.
Figure 2:
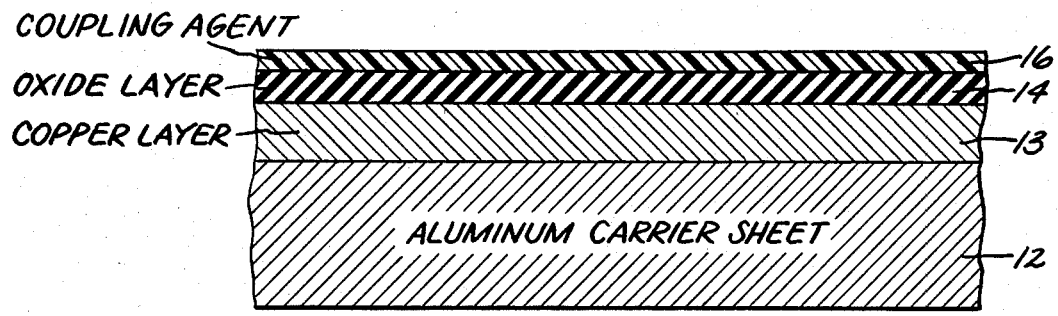
FIG. 2 is a view similar to FIG. 1 representing the assembly immediately prior to lamination.
Figure 3:
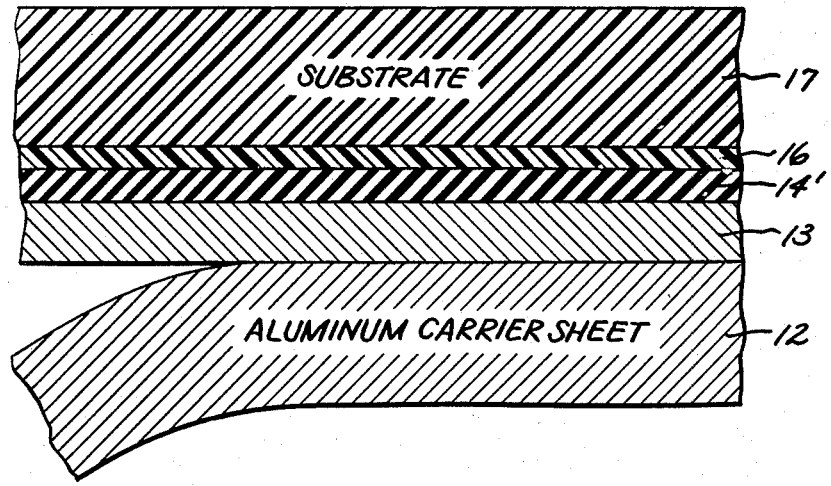
FIG. 3 is a schematic cross-sectional view of the metal-clad laminate of this invention with the carrier sheet partially removed.

The invention described in Ser. No. 227,290 is employed to condition carrier sheet 12 in respect to temperature so that copper film 13 can be formed directly thereon by vapor deposition and the adhesion of copper film 13 to carrier sheet 12 is such that these components can be separated by applying a force of between about 0.20 and 2.0 lbs/in. Preferably, the requisite force will be in the range of about 0.20 to 1.0 lbs/in. Prior to conduct of the process, the carrier surface is to be clean, i.e. free from adhering oil and dirt, and should be relatively smooth and free from gross physical irregularities. During the actual deposition process, which is conducted under vacuum, the surface of carrier 12 is maintained at a temperature in the range of from about 100° to 250° C. It is important that the deposition chamber be well-sealed so that the vacuum pump can be used to control the oxygen and water vapor content to a negligible level during copper deposition to minimize copper oxide formation.

The copper film 13 having been deposited, preferably in a thickness of from 1 to 16 microns (although thicker layers can be used), copper film 13 is then coated with layer 14 (e.g. zinc oxide) by vapor decomposition (usually in the same deposition chamber) in a relatively uniform thickness ranging from about 10 to 1000 Angstroms (preferably in the range 10–100 Angstroms under vacuum with controlled oxygen and water vapor content as monitored by a residual gas analyzer. This oxide layer so deposited thereafter receives layer 16 of a solution of coupling agent. The coupling agent preferably comprises an organosilane, such as γ-aminopropyltriethoxysilane. When the coupling agent material has dried, the assembly of carrier sheet 12, copper film 13, oxide layer 14 and coupling agent layer 16 is bonded to the glass-reinforced epoxy board 17 using a temperature of about 175° C. simultaneously with the application of pressure of about 150 psi for a time of about 30 to about 40 minutes at temperature. The rate of temperature rise is controlled to optimize the rates of curing and epoxy squeeze-out.

EXAMPLE 1

Approximately 5 microns of copper was deposited by evaporation onto a 2 mil thick sheet of aluminum foil. An approximately 100 Angstrom thick layer of zinc oxide was deposited over the copper film at a pressure of 4-5×10$^{-4}$ torr in a vacuum chamber. This composite was then removed from the vacuum chamber and the zinc oxide layer was coated with N-β-(N-vinylbenzylamino)ethyl-γ-aminopropyltrimethoxysilane.monohydrogen chloride coupling agent (Dow Corning Z-6032). The coupling agent solution was prepared by adding 0.5% of coupling agent to water at a pH corrected to 4 using acetic acid. The coupling agent deposited was permitted to dry in air at 100° C. for five minutes.

Thereafter, this assembly was placed upon a glass-reinforced epoxy board with the coupling agent in contact with the surface of the board. The assembly was bonded to the board using a maximum temperature of 178° C. and a maximum pressure of 150 psi for 35 minutes at temperature. Subsequent to lamination, the aluminum foil was removed, and then thin film of copper was built up by electroplating to about 1.4 mil to facilitate the conduct of a peel test. Peel strengths from 8.8 to 9.6 lbs/in were measured with different samples prepared by this process.

Peel strength tests were conducted on a series of samples prepared using different oxides and various coupling agent solutions and it was found by trying various combinations of oxide and coupling agents superior combinations could be routinely determined. Table I below sets forth some of the test results, each result being reported as a range of values (minimum and maximum in lbs/inch) obtained from several tests.

TABLE I

| Coupling Agent | SnO | ZnO | NiO | FeO | Al$_2$O$_3$ |
|---|---|---|---|---|---|
| A-187 | 1.20/4.00 | — | 2.08/4.96 | 1.6/2.8 | 4.0/8.8 |
| A-1100 | 5.2/6.05 | — | 3.20/4.96 | 1.6/3.20 | 4.08/4.64 |
| A-1120 | 3.36/3.84 | — | 2.96/5.76 | 1.12/2.72 | 2.00/3.60 |
| Z-6032 | 4.24/5.68 | 7.0/10.8 | 1.2/2.0 | 1.68/2.64 | 1.04/2.80 |
| Z6040 | 3.92/5.28 | — | 2.40/3.60 | .88/1.76 | 4.0/4.64 |
| NONE | 1.6/3.5 | 2.6/4 | 2.4/3.5 | 1.9/2.7 | 2.24/2.64 |

The coupling agent A-187, A-1100 and A-1120 are manufactured by Union Carbide Corp. and those designated Z-6032 and Z-6040 are manufactured by Dow Corning Corp. The layer of coupling agent solution should be able to uniformly wet the surface contacted and should contain sufficient coupling agent to accommodate most of the binding sites on the adjacent surfaces. Drying of the coupling agent solution should be accomplished below about 100° C. The coupling agents identified in Table I are all organo-functional silanes and have compositions as follows:

| MFGR. DESIGNATION | NAME |
|---|---|
| A-187 | γ-glycidoxypropyltrimethoxysilane |
| A-1100 | γ-aminopropyltriethoxysilane |
| A-1120 | N—β-(aminoethyl)-γ-aminopropyltrimethoxysilane |
| Z-6032 | N—β-(N—vinylbenzylamino)ethylaminopropyltrimethoxysilane monohydrogen chloride (40% silane in methanol) |
| Z-6040 | γ-glycidoxypropyltrimethoxysilane |

The preferred solvent system is methanol and water; however, other conventional solvents can be used. The concentration of coupling agent in the solvent system can be in the range of from 0.1 to 5 volume percent with the preferred range being about 0.2 to about 1.0 volume percent. Optimization is obtained by routine testing.

The following example describes preparation of the coupling agent solution successfully used with zinc oxide and glass reinforced epoxy resin.

EXAMPLE 2

Coupling agent Z-6032 (40 percent silane in methanol) is added to distilled water the pH of which has previously been adjusted to 3.5–5.0 with acetic acid. The coupling agent (5% by volume) is added to the pH adjusted water and then mixed with methanol to produce a final concentration of 0.5 percent by volume coupling agent.

Coupling agents are simply molecules that possess two different kinds of reactivity. Most of the coupling agents used to establish a chemical bond with inorganic surfaces are organo-functional silanes. Silane coupling agents may be represented by the general formula:

$$R'_n SiR_{4-n}$$

where R' is a saturated, unsaturated or aromatic hydrocarbon residue functionalized by a member selected from the group consisting of amino, carbonyl, carboxy, isocyano, azo, diazo, thio, thia, dithia, isothiocyano, oxo, oxa, halo, ester, nitroso, sulfhydryl, halocarbonyl, amido, sulfoamido and multiples and combinations thereof; R is a hydrolyzable group compatible with R' selected from the group consisting of alkoxy, phenoxy, halo, amino, dialkylamino and tertiary peroxyalkyl; and n is an integer having a value of 1-3.

The preferred coupling agents for the practice of this invention are those designated Z-6032 (with zinc oxide) and A-1100 (with tin oxide) applied by dipping. Other suitable methods of application are spraying, brushing, immersion, etc.

Unexpectedly, it has been found that the peel strength of the product produced by this process (through the lamination step) is enhanced significantly either by subjecting the laminate to a heating step or by aging the laminate at room temperature (i.e. about 68° F.).

The improvement produced by either of these treatments was discovered quite by accident. Pieces of sample laminate [ZnO as the oxide layer with Z6032 as the coupling agent (peel strengths of 3-6.2 lbs/in) and SnO as the oxide layer with A1100 as the coupling agent (peel strengths of 5.2-6.05 lbs/in)] were subjected to a simple test procedure used to determine whether objectionable gas content is present in the substrate. In this procedure the samples are coated with silicone oil and deposited in a pot of molten solder (265° C., 20 second exposure). If the gas content is objectionably high, blisters will form under the copper layer and such performance forms a basis for product rejection. Subsequent peel strength tests of these samples (which passed the "solder float test") shows surprising increases: the ZnO sample yielded 8.6-10.8 lbs/in; the SnO sample yielded 6.8-9.0 lbs/in. Still another test sequence has verified the bond strength increase, when the laminate is heated. Thus, ZnO laminate samples peel tested at 125° C. exhibited higher peel strengths than those tested at room temperature. Commercially available laminates tested under the same conditions produced a decrease in peel strength at the elevated temperature.

Thus, it has been found through additional investigation that even though the lamination process is conducted under pressure and at temperature, this temperature exposure during lamination does not optimize the peel strength. However, if the laminate is subject to a re-heat (temperature exposure: about 125° C. to about 300° C.) for a time ranging from about 20 seconds to several minutes, a significant increase in peel strength is obtained.

A suitable piece of apparatus for such a reheat step is one in which the heating is done by vapor transport, as is the mode of heating in solder reflow apparatus.

Peel strength tests conducted on laminations prepared by the practice of this invention (excluding the heating step described above) and aged for periods of at least 3-4 days have normally demonstrated increases in peel strength readings of as much as 1 lb/in, and in no case has the peel strength decreased with age. A test conducted over a 5-month period on laminate produced with zinc oxide and Z-6032 coupling agent has exhibited significant improvement in peel strength, which was maintained with further aging.

TABLE II

| DATE | PEEL STRENGTH (lbs/in) |
|---|---|
| 2/16/82 | 4-5 |
| 2/22/82 | 5.4-10 |
| 7/27/82 | 5.6-9 |

Experiments have produced promising results using a layer of multiple mixed metal oxides as the composite bonding layer in a copper-clad laminate. Metals for the mixed metal oxides are preferably selected from the group consisting of tin, zinc, manganese, magnesium, nickel, aluminum and calcium. Tests conducted with mixed oxide layers embodying at least two metal oxides are reported in Tables III and IV to follow. Preparation of the mixed oxides was accomplished by milling the powders with beta-alumina balls and water overnight (~10 hours) to yield a particle size, when dried and sieved, of less than 60 mesh (U.S. sieve). The powders are pressed into pellets and sintered to yield plugs about one inch in diameter and one inch high. To apply the oxide layer of a given composition the appropriate plugs are introduced into the evaporator as targets from which the oxide material is evaporated and vapor deposited on the copper layer. After application of the oxide layer various coupling agents were applied by the dip and dry method. Thereafter laminates were prepared as described hereinabove. The peel tests for each mixture of oxides together with particular coupling agents as reported in Table IV were conducted by electroplating additional copper over the thin film of the laminate to a thickness of about 1.4 mil and then peeling a ⅛" strip of the copper 8" long from the substrate. During the peeling of each strip at least 100 readings were taken. Table IV presents the lowest value, the highest value and the average value for all the data in each peel test. Coupling agent solution for these tests was prepared by mixing the coupling agent in water (pH=5.5) using about 5% by volume coupling agent and then diluting this solution in alcohol to 0.5% by volume coupling agent.

TABLE III

| Mix #1 | 80 g, Sno, 20 g CaO |
| Mix #2 | 80 g SnO, 20 g MnO |
| Mix #3 | 80 g SnO, 20 g CaO, 20 g MnO |
| Mix #4 | 100 g SnO, 5 g ZnO |
| Mix #5 | 100 g SnO, 1 g ZnO |
| Mix #6 | 100 g ZnO, 1 g SnO |
| Mix #7 | 100 g ZnO, 3 g SnO |
| Mix #8 | 100 g SnO, 20 g MgO |

TABLE IV

| Mix # | Control (lb/in) | 6020 (lb/in) | 6032 (lb/in) | 6040 (lb/in) | 1100 (lb/in) | A-187 (lb/in) |
|---|---|---|---|---|---|---|
| 1 | 2.64/3.52 | 1.12/1.76 | — | .08/4.0 | 3.04/4.08 | — |
|   | avg = 3.06 | avg = 1.46 |   | avg = 3.24 | avg = 2.78 |   |
| 2 | 2.8/4.16 | .96/1.6 | — | 4.64/5.36 | 2.0/4.0 | — |
|   | avg = 3.41 | avg = 1.36 |   | avg = 5.15 | avg = 2.78 |   |
| 3 | 3.2/4.8 | 4.64/6.8 | 2.64/7.12 | 3.6/7.36 | 6.24/8.56 | 2.96/5.76 |
|   | avg = 4.05 | avg = 5.81 | avg = 4.54 | avg = 5.23 | avg = 7.18 | avg = 4.76 |
| 4 | 2.72/3.6 | 4.16/5.6 | 4.16/7.84 | 3.28/6 | 5.92/9.68 | 2.48/6.72 |
|   | avg = 3.24 | avg = 5.05 | avg = 6.35 | avg = 4.70 | avg = 7.16 | avg = 3.96 |
| 5 | 2.88/4.08 | 5.36/7.2 | 3.76/9.04 | 3.6/5.84 | 5.04/7.28 | .56/12.8 |
|   | avg = 3.48 | avg = 6.46 | avg = 6.11 | avg = 4.90 | avg = 6.45 | avg = 4.99 |
| 6 | 1.76/2.96 | 5.44/7.2 | 3.12/5.12 | 5.04/7.24 | 6.96/8.4 | 4/6.72 |
|   | avg = 2.44 | avg = 6.18 | avg = 4.17 | avg = 6.41 | avg = 7.66 | avg = 5.39 |
| 7 | 1.44/3.44 | 5.52/6.72 | 1.36/3.52 | 2.16/4.32 | 5.04/6.8 | 3.28/6.88 |
|   | avg = 2.45 | avg = 6.08 | avg = 2.24 | avg = 3.02 | avg = 6.03 | avg = 5.46 |
| 8 | 2.16/3.92 | 2.32/4.4 | 3.2/6.72 | 4.8/6.56 | 4.96/8.16 | 4.8/7.04 |
|   | avg = 3.49 | avg = 3.14 | avg = 5.16 | avg = 5.57 | avg = 6.58 | avg = 6.19 |

Peel strengths averaging in excess of 4.5 lb/in are expected to be useful in certain commercial applications. Additional testing utilizing a greater spectrum of compositions and/or coupling agents may provide further increases in peel strengths.

In addition to determining that mixtures of metal oxides are encompassed within this invention, it has also been found that some mixing of coupling agents can be tolerated. Further experimentation utilizing different proportions of particular component coupling agents may identify improved results, but work to date (Table V) has not established any advantage to mixing coupling agents. In each of the coupling agent mixtures, the component coupling agents were mixed in equal parts by volume to prepare the initial 5% mixture in water. The water solution was then diluted in alcohol to yield the solution of 0.5 vol. % coupling agent in alcohol actually used.

TABLE V

| Mix # | Control (lb/in) | 6032/6040 (lb/in) | 1100/6020 (lb/in) | 1100/6032 (lb/in) | 1100/6040 (lb/in) |
|---|---|---|---|---|---|
| 1 | 2.64/3.52 | 2.48/7.12 | 3.84/5.76 | 2.56/4.72 | .64/1.44 |
|   | avg = 3.06 | avg = 4.46 | avg = 4.66 | avg = 4.14 | avg = 1.00 |
| 2 | 2.8/4.16 | 3.2/7.68 | 3.12/7.92 | 4.4/6.4 | .48/2.32 |
|   | avg = 3.41 | avg = 5.72 | avg = 5.72 | avg = 5.48 | avg = 1.25 |
| 3 | 3.2/4.8 | 2.8/8.24 | 3.2/6.96 | 4.0/5.6 | .88/2.24 |
|   | avg = 4.05 | avg = 6.36 | avg = 5.14 | avg = 4.95 | avg = 1.41 |
| 4 | 2.72/3.6 | 2.88/7.36 | 4.4/5.84 | 4.16/6.88 | 1.68/2.4 |
|   | avg = 3.24 | avg = 5.63 | avg = 5.17 | avg = 5.34 | avg = 2.03 |
| 5 | 2.88/4.08 | 3.12/8.24 | 4.0/6.48 | 3.84/6.88 | 1.6/2.96 |
|   | avg = 3.48 | avg = 5.81 | avg = 5.29 | avg = 5.99 | avg = 2.32 |
| 6 | 1.76/2.96 | 2.88/4.96 | 1.6/4.08 | 3.52/6.32 | 1.04/2.64 |
|   | avg = 2.44 | avg = 3.85 | avg = 2.96 | avg = 4.39 | avg = 1.73 |
| 7 | 1.44/3.44 | 4.32/7.52 | 1.92/3.2 | 4.32/6.32 | 2.08/3.52 |
|   | avg = 2.45 | avg = 6.10 | avg = 2.55 | avg = 5.20 | avg = 2.93 |
| 8 | 2.16/3.92 | 4.32/8.56 | 2.96/6.16 | 4.08/6.48 | 1.6/3.52 |
|   | avg = 3.49 | avg = 6.71 | avg = 5.14 | avg = 5.41 | avg = 2.60 |

What we claim as new and desire to secure by Letters Patent of the United States is:

1. A metal-clad laminate comprising a substrate, an interacted coupling agent layer extending over and bonded to a major surface of said substrate, a layer of ultra-thin copper adjacent said layer of interacted coupling agent and a composite bonding layer interconnecting said copper layer and said interacted coupling agent layer, said composite bonding layer being substantially free of copper oxide and comprising regions of copper alloyed with a second metal and oxide of said second metal.

2. The metal-clad laminate of claim 1 wherein the substrate is a sheet of resin reinforced with glass fibers.

3. The metal-clad laminate of claim 1 wherein the second metal is selected from the group consisting of zinc and tin.

4. The metal-clad laminate of claim 1 wherein the coupling agent layer contains a plurality of coupling agent materials.

5. The metal-clad laminate of claim 1 wherein a carrier sheet is adhered to the surface of the layer of ultra-thin copper.

6. The metal-clad laminate of claim 1 wherein oxide of an additional non-copper metal is also present in the composite bonding layer.

7. The metal-clad laminate of claim 6 wherein the additional non-copper metal is selected from the group consisting of tin, zinc, manganese, magnesium, nickel, aluminum and calcium.

8. The metal-clad laminate of claim 1 wherein the coupling agent is organosilane-based.

9. The metal-clad laminate of claim 8 wherein the second metal is tin and the coupling agent is γ-aminopropyltriethoxysilane-based.

10. The metal-clad laminate of claim 8 wherein the second metal is zinc and the coupling agent is N-β-(N-vinylbenzyl-amino)ethyl-γ-aminopropyltrimethoxysilane.monohydrogen chloride-based.

11. The method of making a copper-clad laminate comprising the steps of:
   (a) maintaining a carrier sheet with the temperature of a major surface thereof in a preselected temperature range while forming a copper film on said major surface by vapor depositing copper directly thereon, (b) depositing a layer of an oxide material over said copper film under conditions of temperature and pressure substantially precluding the formation of copper oxide, said oxide material comprising an oxide of a non-copper metal,
(c) coating said oxide material layer with a solution containing coupling agent,
(d) drying said coupling agent and
(e) laminating the resulting assembly to a major surface of a substrate at elevated temperature and pressure, said substrate major surface having binding sites available for said coupling agent.

12. The method of claim 11 including the additional step of heating the resulting laminate to a temperature in the range of from about 125° C. to about 300° C. for a time ranging from about 20 seconds to about several minutes.

13. The method of claim 11 including the additional step of aging the resulting laminate for a period of at least 4 days.

14. The method of claim 11 including the additional step of stripping the carrier sheet from the resulting laminate.

15. The product resulting from the practice of the method of claim 11.

* * * * *